United States Patent
Aderhold et al.

(10) Patent No.: US 12,159,797 B2
(45) Date of Patent: Dec. 3, 2024

(54) PYROMETRY ERROR DETECTION SENSOR FOR RTP TEMPERATURE CONTROL SYSTEM

(71) Applicant: Applied Materials, Inc., Santa Clara, CA (US)

(72) Inventors: Wolfgang Aderhold, Santa Clara, CA (US); Samuel Howells, Portland, OR (US); Amritha Rammohan, Milpitas, CA (US); Huy Q. Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 523 days.

(21) Appl. No.: 17/403,693

(22) Filed: Aug. 16, 2021

(65) Prior Publication Data

US 2023/0051521 A1    Feb. 16, 2023

(51) Int. Cl.
*H01L 21/67* (2006.01)
*G01J 5/00* (2022.01)
(Continued)

(52) U.S. Cl.
CPC .......... *H01L 21/67248* (2013.01); *G01J 5/00* (2013.01); *G01J 5/0806* (2013.01); *G01J 5/0818* (2013.01); *G01J 5/806* (2022.01)

(58) Field of Classification Search
CPC ......... H01L 21/67248; H01L 21/67034; H01L 21/67069; H01L 21/67115; G01J 5/00; G01J 5/0806; G01J 5/0818; G01J 5/806; G01J 5/0007; G01J 5/0814; G01J 5/80; G01J 5/802
See application file for complete search history.

(56) References Cited

U.S. PATENT DOCUMENTS 5,830,277 A * 11/1998 Johnsgard ......... H01L 21/67248
118/712
6,183,130 B1 * 2/2001 Adams .................. G01J 5/0808
219/405
(Continued)

FOREIGN PATENT DOCUMENTS

JP    2001514441 A    9/2001
JP    2006093302 A    4/2006
(Continued)

OTHER PUBLICATIONS

International Search Report and Written Opinion from Patent Application No. PCT/US2022/036932 dated Jan. 11, 2023, 10 pgs.
(Continued)

*Primary Examiner* — Brandi N Hopkins
*Assistant Examiner* — Janice M Soto
(74) *Attorney, Agent, or Firm* — Schwabe, Williamson & Wyatt, P.C.

(57) ABSTRACT

Embodiments disclosed herein include a method for determining a temperature error of a pyrometer. In an embodiment, the method comprises measuring a first signal with a first sensor of the pyrometer and measuring a second signal with a second sensor of the pyrometer. In an embodiment, the method further comprises determining a reflectivity of a reflector plate from the first signal and the second signal, and determining the temperature error using the reflectivity.

10 Claims, 7 Drawing Sheets

(51) Int. Cl.
  *G01J 5/0806* (2022.01)
  *G01J 5/0818* (2022.01)
  *G01J 5/80* (2022.01)

(56) References Cited

U.S. PATENT DOCUMENTS

2006/0051077 A1 * 3/2006 Kubo ............... H01L 21/67248
  392/416
2006/0086713 A1   4/2006 Hunter et al.

FOREIGN PATENT DOCUMENTS

| JP | 2006512590 A | 4/2006 |
| KR | 1020140088857 A | 7/2014 |
| TW | 202123341 A | 6/2021 |

OTHER PUBLICATIONS

Preliminary Report on Patentability from PCT/US2022/036932 dated Feb. 29, 2024, 6 pgs.
Official Letter from Taiwan Patent Application No. 111126791 dated Aug. 20, 2024, 13 pgs.

* cited by examiner

PYROMETRY ERROR DETECTION SENSOR FOR RTP TEMPERATURE CONTROL SYSTEM

BACKGROUND

1) Field

Embodiments of the present disclosure pertain to the field of semiconductor processing and, in particular, to rapid thermal processing (RTP) temperature control systems.

2) Description of Related Art

Rapid thermal processing (RTP) includes a chamber with an array of heating elements opposite from a substrate. The heaters rapidly increase the temperature of the substrate in order to implement a processing condition on the substrate. The heating elements are controlled, at least in part, by pyrometers below the substrate. The pyrometers are contactless temperature measurement solutions.

During processing in RTP systems, molecules from the substrate surface can sublime and redeposit on the chamber surfaces. The view ports of the pyrometer to measure the wafer radiation and determine the wafer temperature get gradually coated during use of the RTP system. This results in temperature errors that cause the control system to drive the processing out of specification.

SUMMARY

Embodiments disclosed herein include a method for determining a temperature error of a pyrometer. In an embodiment, the method comprises measuring a first signal with a first sensor of the pyrometer and measuring a second signal with a second sensor of the pyrometer. In an embodiment, the method further comprises determining a reflectivity of a reflector plate from the first signal and the second signal, and determining the temperature error using the reflectivity.

Embodiments disclosed herein may also include processing tools with a pyrometer that can detect temperature error. In an embodiment a processing tool comprises a chamber, a substrate support in the chamber, and a reflector below the substrate support. In an embodiment, a heating unit is coupled to the chamber, wherein the heating unit is configured to heat a substrate supported by the substrate support. In an embodiment, the processing tool further comprises a pyrometer passing through the reflector, wherein the pyrometer is configured to measure a temperature of the substrate. In an embodiment, the pyrometer comprises a light pipe, focusing optics, a first sensor configured to detect light emitted from a relatively small spot on the substrate above the light pipe, and a second sensor configured to detect light from a wider angle than the first sensor.

Embodiments disclosed herein may also include systems with a pyrometer that can detect temperature error. In an embodiment, a system for processing substrates comprises a chamber, a substrate holder for supporting a substrate, a heating element for heating the substrate, a reflector plate below the substrate, and a pyrometer through the reflector and configured to measure a temperature of the substrate. In an embodiment, the pyrometer is capable of being used to detect a temperature error resulting from deposition on the reflector plate. In an embodiment, a method to detect the temperature error comprises measuring a first signal with a first sensor of the pyrometer, measuring a second signal with a second sensor of the pyrometer, determining a reflectivity of the reflector plate from the first signal and the second signal, and determining the temperature error using the reflectivity.

DETAILED DESCRIPTION

Rapid thermal processing (RTP) temperature control systems are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects are not described in detail in order to not unnecessarily obscure embodiments of the present disclosure. Furthermore, it is to be understood that the various embodiments shown in the Figures are illustrative representations and are not necessarily drawn to scale.

As noted above, redeposition of substances on the interior surfaces of an RTP system (e.g., a reflector plate or quartz window) result in errors in the temperature measurement made by the pyrometers. Additionally, other changes to the surfaces (e.g., chemical reactions or other damage) may also result in errors in the temperature measurement made by the pyrometers. As such, the temperature of the substrate is potentially moved out of specification, and can result in damage to the substrate, and potentially the need to scrap the substrate in some instances. Accordingly, embodiments disclosed herein include systems and processes for detecting temperature error in the readings of the pyrometers. As such, the true temperature of the substrate can be determined and controlled to be within a given specification.

In an embodiment, the temperature error calculation is implemented through the use of a dual channel pyrometer. A first channel is an emissometer sensor that detects light emitted from a small spot on the substrate. The reading from the first channel may be denoted as IE. A second channel is the main sensor that detects a range of radiation from a wider angle. The majority of the main channel radiation stems from multiple reflections of an area around the pyrometer location. Due to the many reflections, the substrate essentially becomes a virtual black body with a reflectance R being essentially equal to 1. The reading from the second channel may be denoted as IM. The ratio of IE/IM can then be used to determine the reflectivity of a reflective plate below the substrate. The decrease in the reflectivity is proportional to the temperature error. In order to move from a proportional value of the temperature error to an actual value of the temperature error, a series of charts are used. In addition to finding the change chance in reflectance using a dual channel pyrometer, changes in reflectance can be determined using a laser based system. For example, a processing tool may include a laser source that is used to interrogate a surface (e.g., the reflector plate) in order to detect changes in the reflectance.

In yet another embodiment, similar processes may be utilized in order to detect coatings on a quartz window that separates the heating elements from the chamber. With the substrate removed, the pyrometers can detect the temperature of the quartz window. A dual channel investigation of the quartz window may be used to determine the presence of a coating on the quartz window, which can alter the processing of substrates in the tool.

In some embodiments, the temperature error may be used in an artificial intelligence (AI) or machine learning (ML) context. For example, the measured temperature error may be compared to a temperature error calculated with a physics model. If the measured temperature error and the calculated temperature error are relatively close to each other, then the physics model is accepted as true. If there is a larger difference between the measured temperature error and the calculated temperature error, then the physics model may be retuned.

In some embodiments, the change in reflectance may also be used in a cleaning operation in order to detect a cleaning endpoint. For example, a plasma etching process may be used to remove coatings on interior surfaces. As the coating is removed, the reflectance will change. When the reflectance value is returned to a known level (i.e., a known reflectance of the reflector in an uncoated state), then it can be determined that the cleaning operation is completed.

Figure 1:
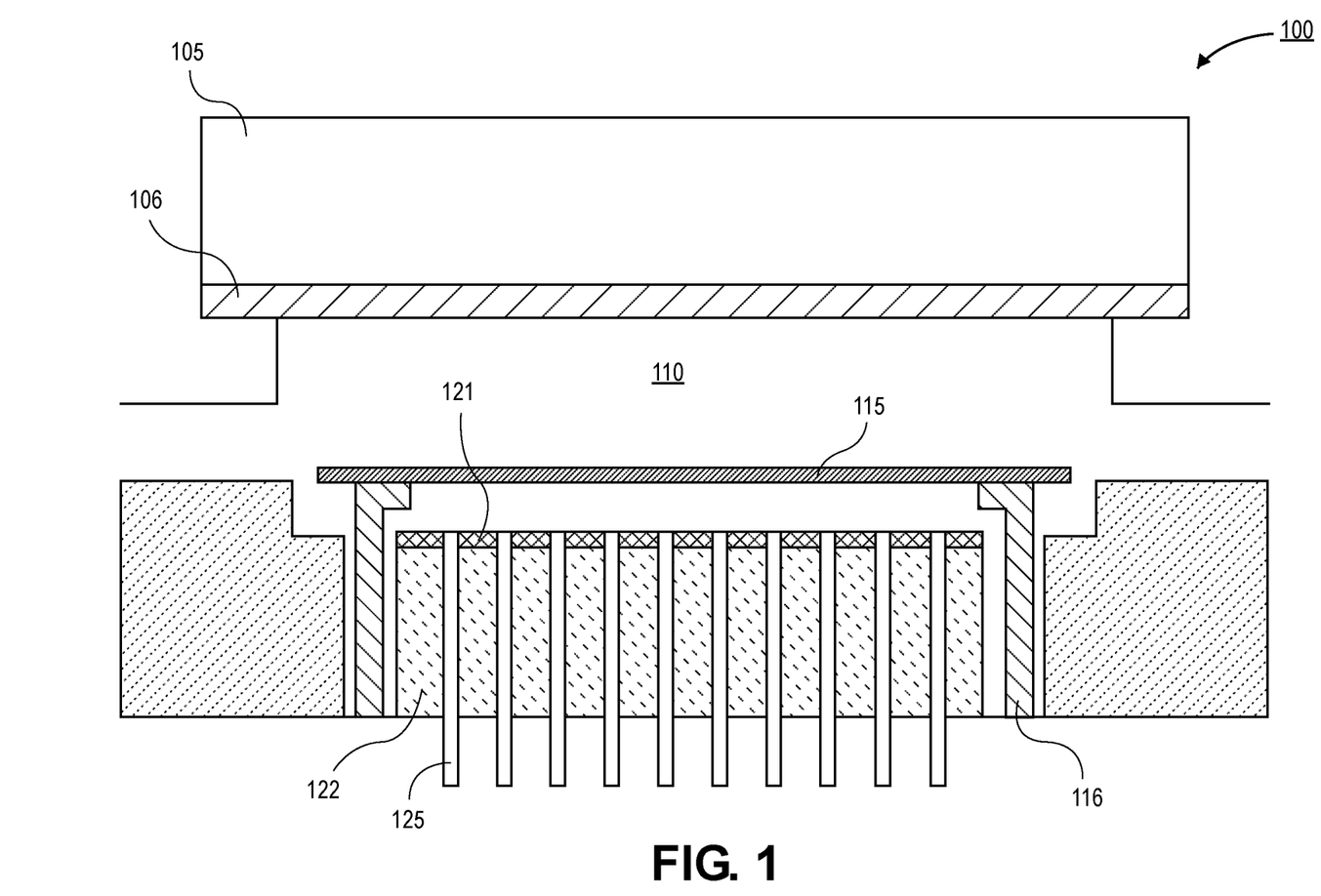
FIG. 1 is a cross-sectional illustration of a rapid thermal processing (RTP) system, in accordance with an embodiment.

Referring now to FIG. 1, a cross-sectional illustration of an RTP tool 100 is shown, in accordance with an embodiment. In an embodiment, the RTP tool comprises a chamber 110. A heating element 105 is provided above the chamber 110. The heating element 105 may be separated from the chamber 110 by a window 106. While shown as a single device, the heating element 105 may comprise a plurality of discrete heating elements. For example, a plurality of heat lamps may be provided across the top of the chamber 110.

In an embodiment, a substrate 115 may be supported by supports 116 in the chamber 110. The substrate 115 may be any type of substrate typical of semiconductor manufacturing processes. For example, the substrate 115 may be a wafer, such as a silicon wafer. In other embodiments, the substrate 115 may be a glass substrate with a non-circular form factor. For example, the substrate 115 may have a rectangular shape in some embodiments. In an embodiment, the supports 116 may raise the substrate 115 above a reflector plate 121. The supports 116 may also be configured to rotate the substrate 115 in some embodiments.

In an embodiment, the reflector plate 121 may be provided over a base 122. A plurality of pyrometers 125 may pass through the base 122 and the reflector plate 121. In an embodiment, the top portion of the pyrometers 125 are shown in FIG. 1. Particularly, the light pipe portion of the pyrometers 125 are shown. Additional optics and sensors of the pyrometers 125 are not shown in FIG. 1, and are described in greater detail below with respect to FIG. 2.

In an embodiment, the pyrometers 125 are used in a control system in order to maintain the substrate 115 at a desired temperature. For example, the pyrometers 125 may be coupled to a controller that takes the temperature information from the pyrometers 125 as an input and provides a control effort to the heating element 105 as an output. As will be described in greater detail below, the pyrometers 125 may be dual channel pyrometers. The use of dual channel pyrometers 125 allows for temperature error to be calculated, as will be described in greater detail below.

Figure 2:
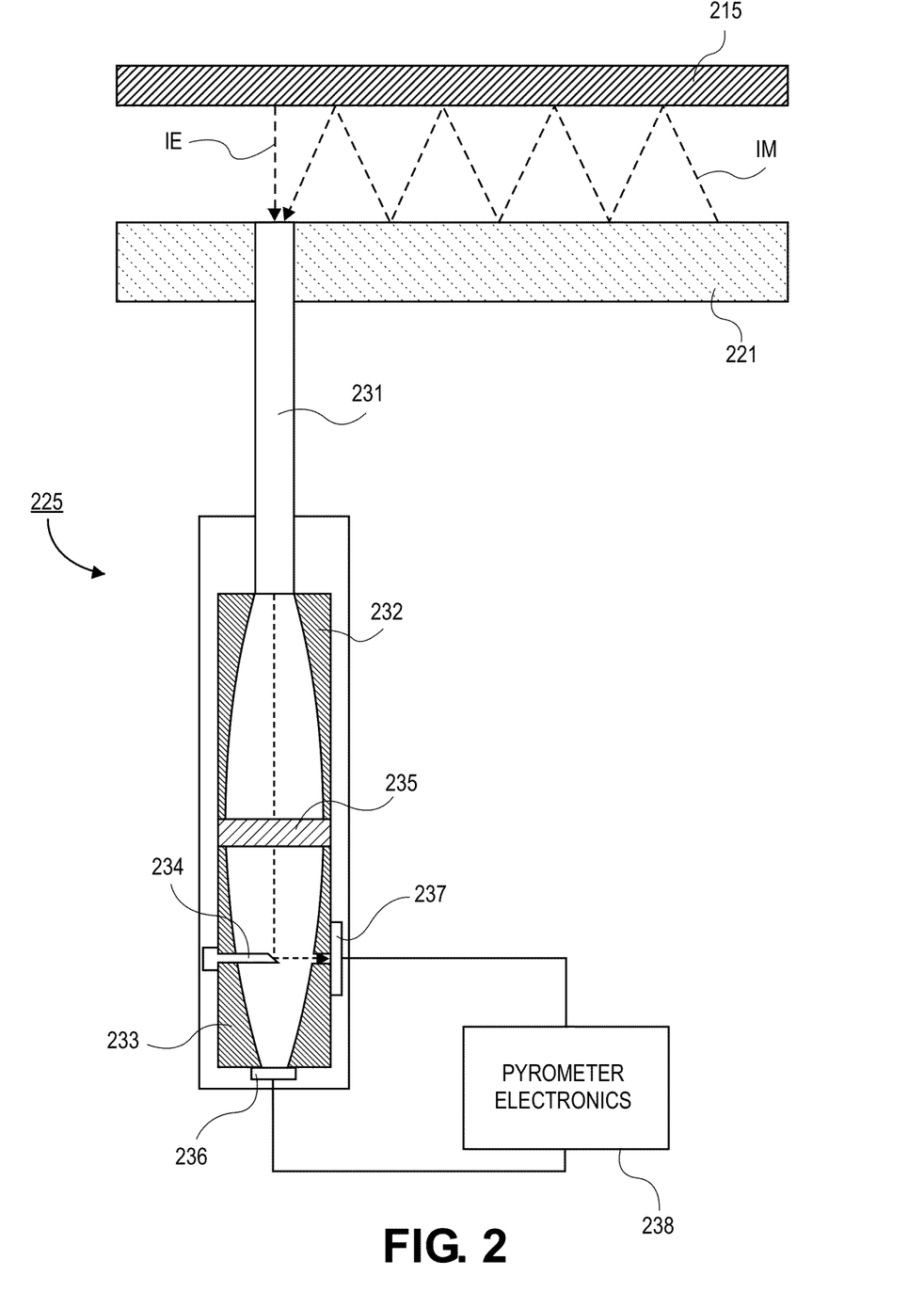
FIG. 2 is a schematic illustration of a dual channel pyrometer in a RTP system, in accordance with an embodiment.

Referring now to FIG. 2, a cross-sectional illustration of a pyrometer 225 is shown, in accordance with an embodiment. As shown, the pyrometer 225 includes a light pipe 231. The light pipe 231 passes through the base (not shown) and the reflector plate 221. The light pipe 231 takes in light from different areas. A first portion of the input light is designated IE. The IE light is from a substrate 215 directly over the light pipe 231. A second portion of the input light is designated IM. The IM light is reflected multiple times between the substrate 215 and the reflector 221 before reaching the light pipe 231.

In an embodiment, the pyrometer 225 further comprises a first optics region 232. The first optics region 232 collimates the incoming light before it reaches a filter 235. A second optics region 233 is provided after the filter 235. The second optics region 233 is a concentrator. The concentrator in the second optics region 233 focuses the light down to a first sensor 236. The first sensor 236 receives the IM light and may be referred to as an IM sensor 236. A reflector 234 may also be provided in the second optics region 233. The reflector 234 is oriented in the middle of the pyrometer 225 and reflects the IE light to a second sensor 237. The second sensor 237 may be referred to as the IE sensor 237. In an embodiment, the IM sensor 236 and the IE sensor 237 are photodetectors. That is, the photons of the IM light and the IE light induce a current that can be used to determine the intensity of either light source. The IM sensor 236 and the IE sensor 237 may be electrically coupled to pyrometer electronics 238. The pyrometer electronics 238 may be used to implement one or more processes to determine temperature error, as will be described in greater detail below.

Figure 3:
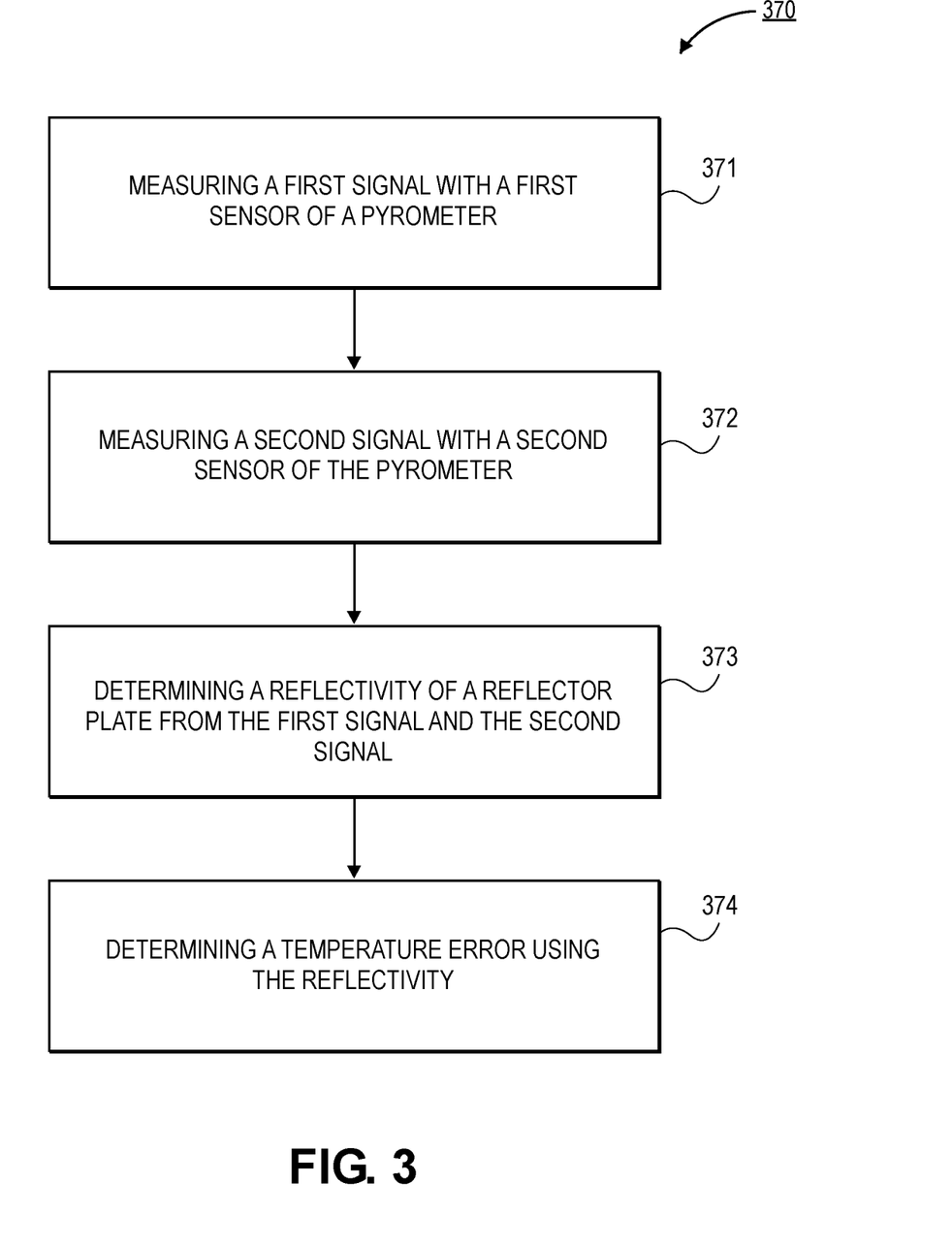
FIG. 3 is a flow diagram of a process for determining a temperature error of a pyrometer in a RTP system, in accordance with an embodiment.

Referring now to FIG. 3, a flow diagram of a process 370 for determining a temperature error of a pyrometer is shown, in accordance with an embodiment. In an embodiment, the process 370 may be implemented on a RTP tool, such as the RTP tool described above with respect to FIG. 1 and FIG. 2. In a particular embodiment, the RTP tool includes a dual channel pyrometer that allows for the detection of an IE signal and an IM signal.

In an embodiment, process 370 may begin with operation 371, which comprises measuring a first signal with a first sensor of a pyrometer. In an embodiment, the first signal may be an IE signal and the first sensor may be an IE sensor. In an embodiment, the IE signal may be routed to the IE sensor using a reflector in the pyrometer. The reflector may be similar to the reflector 234 described in greater detail above. Accordingly, the IE signal may be light from directly above the light pipe. In an embodiment, the value of IE is provided by Equation 1. In Equation 1, $\epsilon$ is the emissivity of the substrate, $\sigma$ is the Stefan-Boltzman constant, and T is temperature.

$$IE \sim \epsilon \cdot \sigma \cdot T^4 \qquad \text{Equation 1}$$

In an embodiment, process 370 may continue with operation 372, which comprises measuring a second signal with a second sensor of the pyrometer. In an embodiment, the second signal may be an IM signal and the second sensor may be an IM sensors. The IM signal may be obtained from a wide angle over the light pipe. In an embodiment, the value of IM is provided by Equation 2. In Equation 2, $\epsilon$ is the emissivity of the substrate, $\sigma$ is the Stefan-Boltzman constant, T is temperature, and R is the reflectivity of the reflective plate.

$$IM \sim \frac{\epsilon \cdot \sigma \cdot T^4}{1 - R(1 - \epsilon)} \quad \text{Equation 2}$$

While described as being two distinct operations, it is to be appreciated that operations 371 and 372 may occur at the same time. That is, the IM value and the IE value may be obtained at substantially the same time. However, it is to be appreciated that the IM value and the IE value may be obtained at different times in some embodiments.

In an embodiment, the process 370 continues with operation 373, which comprises determining a reflectivity of a reflector plate from the first signal and the second signal. Particularly, the reflectivity R may be obtained by taking the ratio of IE over IM. The ratio of IE over IM is provided in Equation 3.

$$\frac{IE}{IM} = 1 - R(1 - \epsilon) \quad \text{Equation 3}$$

Equation 3 can be rearranged into Equation 4 in order to isolate the reflectivity R.

$$R = \frac{\left(1 - \frac{IE}{IM}\right)}{(1 - \epsilon)} \quad \text{Equation 4}$$

The reflectivity R can be used to find an absorption coefficient $\alpha$, as shown in Equation 5, where $R_0$ is the original reflectivity of the reflective plate. The absorption coefficient $\alpha$ is proportional to the losses due to the change in the reflective plate during the processing of multiple substrates. The absorption coefficient $\alpha$ can be used to provide a relative temperature error. However, it is to be appreciated that embodiments may also include the ability to calculate an actual temperature error. As such, the true value of the temperature can be used to control the RTP tool.

$$\alpha = \frac{R_0}{R} \quad \text{Equation 5}$$

Figure 4A:
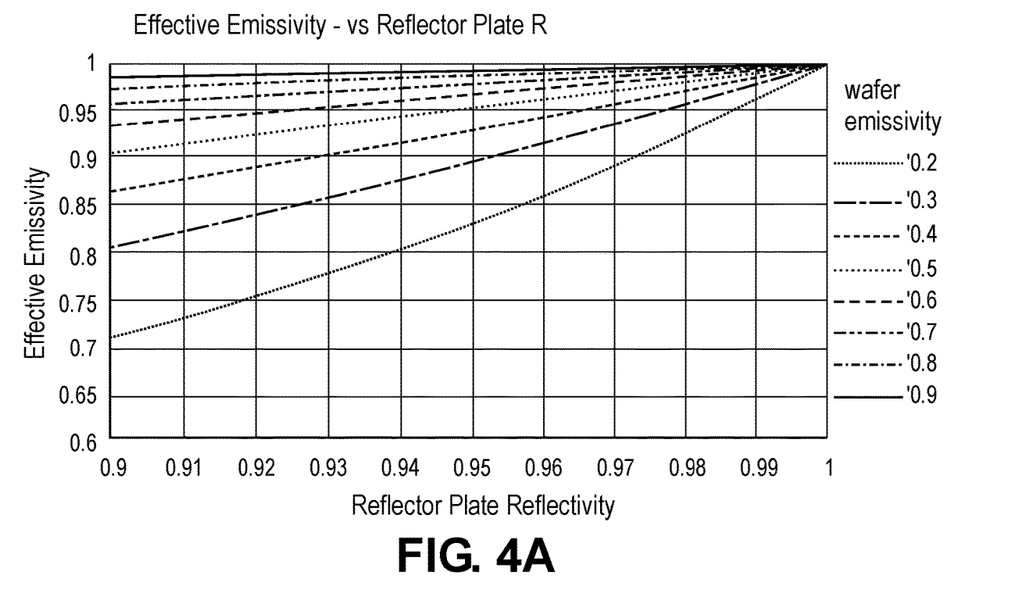
FIG. 4A is a graph of effective emissivity versus reflector plate reflectivity, in accordance with an embodiment.

In an embodiment, process 370 continues with operation 374 which comprises determining a temperature error using the reflectivity. In an embodiment, a series of charts that can be generated allow for the actual temperature error to be determined. For example, charts similar to those provided in FIGS. 4A-4C can be used. Referring now to FIG. 4A, a graph of the reflector plate reflectivity versus the effective emissivity for a range of wafer emissivities is shown, in accordance with an embodiment. In an embodiment, the effective emissivity $E_{eff}$ is provided by Equation 6. As indicated by the graph, as the value of R approaches 1, the effective emissivity $E_{eff}$ goes to 1 as well. In such an instance, the system is modeled as a true black body.

$$E_{eff} = \frac{(\epsilon)}{1 - R(1 - \epsilon)} \quad \text{Equation 6}$$

$$IM \sim E_{eff} \quad \text{Equation 7}$$

Figure 4B:
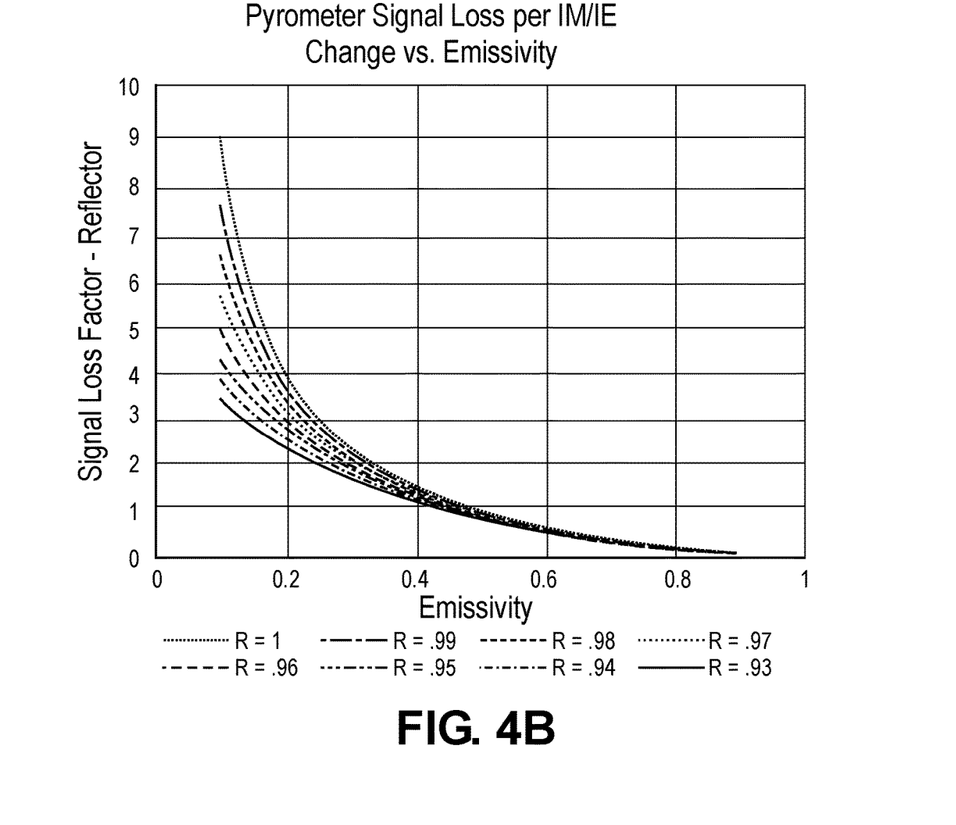
FIG. 4B is a graph of relative signal loss versus substrate emissivity, in accordance with an embodiment.

The signal is proportional to the effective emissivity $E_{eff}$, as expressed in Equation 7. Particularly, the derivative of the relative signal loss is provided by Equation 8. Equation 8 is graphically provided in FIG. 4B, which illustrates a graph of the wafer emissivity versus relative signal loss per reflectivity change for a range of reflector plate reflectivities. For example, for a substrate with emissivity E of 0.7, the relative signal loss is 0.4. Since the signal loss is per reflectivity change, a 1% change in the reflectivity R results in a 0.4% radiation loss. However, it is to be appreciated that other losses may be included as well. For example, the losses due to absorption from the light pipe surface may also be added to the radiation loss. For example, the light pipe coating may result in an additional 1.0% radiation loss for a total radiation change of −1.4%.

$$\text{Relative Signal Loss } dIM/dR = \quad \text{Equation 8}$$
$$\frac{dE_{eff}}{dR} = \varepsilon(1 - \varepsilon) \cdot (1 - R(1 - \varepsilon))^{-2}$$

Figure 4C:
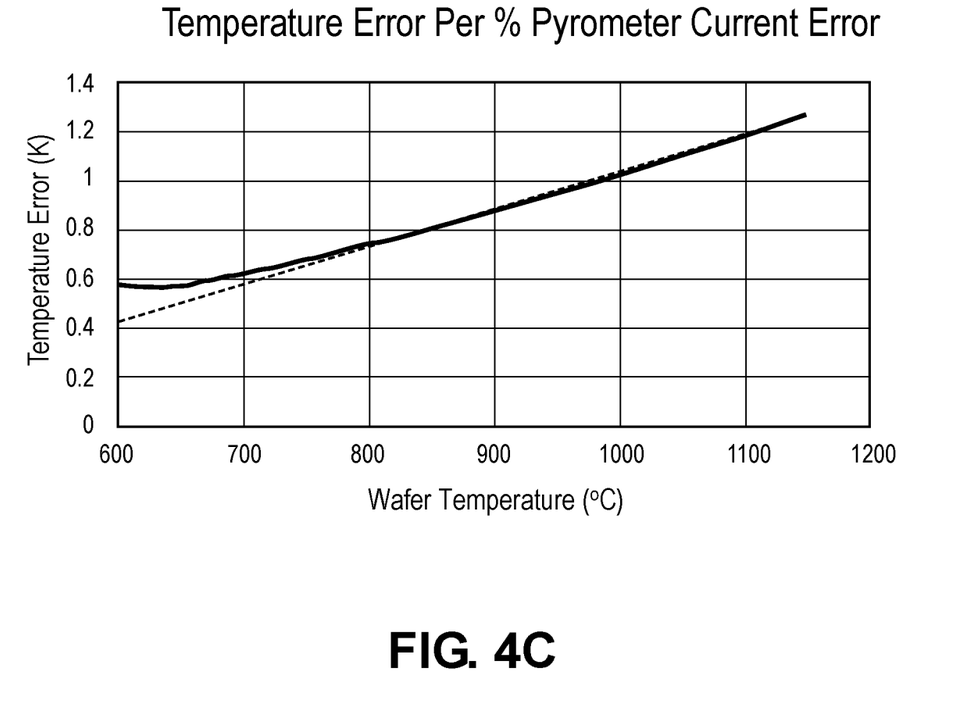
FIG. 4C is a graph of temperature error versus substrate temperature, in accordance with an embodiment.

In order to move from a relative signal loss to an actual value of the temperature error, the graph in FIG. 4C is used. FIG. 4C is a chart showing the temperature error per percentage pyrometer current error versus temperature of the substrate. For example, at substrate temperatures of 1100° C., the temperature error is 1.2K/%. In the case described above, the total loss is −1.4%. This results in a temperature error equal to 1.2K/% x−1.4%=−1.7K.

The use of such processes can be used to determine temperature errors that are useful in the control of the heating units of the RTP tool in order to keep the processing conditions within a predetermined threshold. In addition to control applications, the temperature offsets can be used to validate one or more models that are running in conjunction with the RTP tool. For example, the accuracy of machine learning and/or artificial intelligence models may be confirmed using processes to determine temperature offsets. An example of such a process flow is provided in FIG. 5.

Figure 5:
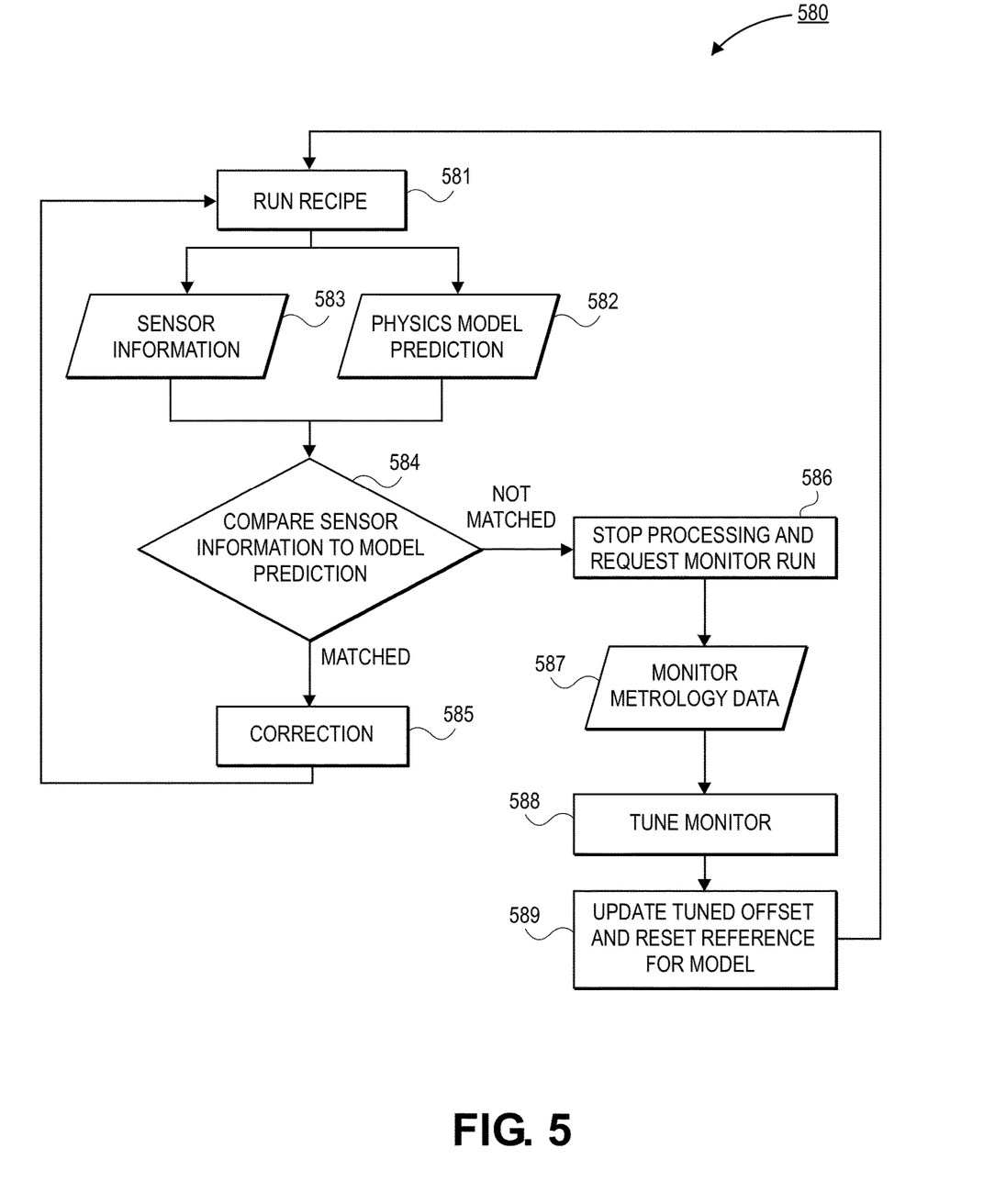
FIG. 5 is a flow diagram of a process for comparing temperature error provided by the pyrometer to a temperature error provided by a thermal model, in accordance with an embodiment.

Referring now to FIG. 5, a flow diagram of a process 580 for validating a model is shown, in accordance with an embodiment. In an embodiment, the model that is being validated is a physics based model. A physics based model uses physical parameters and physics based phenomenon to chart the results of various processing conditions. The goal of a physics based model is to match the actual processing within a chamber as close as possible. The physics based model may be used as part of a machine learning or artificial intelligence algorithm for controlling a processing tool, such as an RTP tool.

In an embodiment, the process 580 may begin with operation 581, which comprises running a recipe. The recipe may be any recipe suitable for processing substrates or for implementing planned maintenance (PM). In some embodiments, the recipe may occur at the end of PM in order to revalidate the physics based model.

In an embodiment, the process 580 branches into two parallel operations. In an embodiment, the first branch includes obtaining sensor information at block 583, and the second branch includes obtaining physics model predictions at block 582. The sensor information block 583 may include processes similar to the processes described in greater detail above in order to determine a temperature error of the pyrometers. For example, a dual channel pyrometer may be used to find IM and IE values and the corresponding reflectivity of the reflective plate. The reflectivity can then be used to generate an actual temperature error of the pyrometers. On the second branch, a physics model is queried in order to determine what the physics model believes the true temperature of the substrate is given the parameters of the recipe, the tool settings, and other pertinent tool information (e.g., historic data, or the like).

The process 580 then proceeds to operation 584, which includes comparing the sensor information to the model prediction. The sensor information will provide a true temperature of the substrate during the recipe (i.e., the measured temperature plus the temperature error), and the model prediction provides a modeled temperature of the substrate during the recipe. In an embodiment, the true temperature and the modeled temperature may be a single temperature point during the process. In other embodiments, the true temperature and the modeled temperature may be temperature maps across the surface of the substrate. The temperature maps may be at a single point in time during the recipe or may include temperature maps at multiple times during the recipe.

In an embodiment, the decision block 584 determines if the true temperature and the modeled temperature are matched or not matched. Matched temperatures may refer to two temperatures that are within a certain threshold of each other. For example, a true temperature may be considered as matching the modeled temperature if the modeled temperature is between 90% and 110% of the true temperature. In other embodiments, the modeled temperature is considered as matching the true temperature if the modeled temperature is between 99% and 101% of the true temperature.

In an embodiment, when the temperatures are a match, the correction to the temperature is accepted at block 585. That is, the physics model is accepted, and the process may loop back to running the recipe. The same recipe may be run, or a different recipe may be run. For example, the subsequent recipe may be a recipe for production substrates.

In an embodiment, when the temperatures do not match, the process 580 proceeds to block 586, which comprises stopping the process and requesting a monitor run. In an embodiment, the monitor run may be a method for recalibrating the physics based model used in block 582. In an embodiment, the process 580 then continues to operation 587, which comprises monitoring metrology data. The metrology data may be physical metrology that is performed on the substrate that was processed with the initial recipe in block 581. In other embodiments, virtual metrology may be performed. Virtual metrology may refer to metrology that is derived from one or more sensor outputs in the processing tool. For example, the temperature error calculation may be one example of virtual metrology that can be used to refine the physics based model.

In an embodiment, process 580 may further continue with tuning the physics model at block 588. Tuning the physics model may include applying the various metrology inputs into the physics model in order to more accurately map a given process in the RTP tool. In an embodiment, the tuning may be implemented offline. In other embodiments, machine learning or artificial intelligence algorithms may be used to auto-tune the physics model.

In an embodiment, process 580 may further continue with operation 589, which comprises updating the tuned offset and resetting the reference for the physics model. After the model has been reset following the tuning process, the process may continue by repeating the recipe at block 581. The process may then continue following the process loop any number of times.

Figure 6:
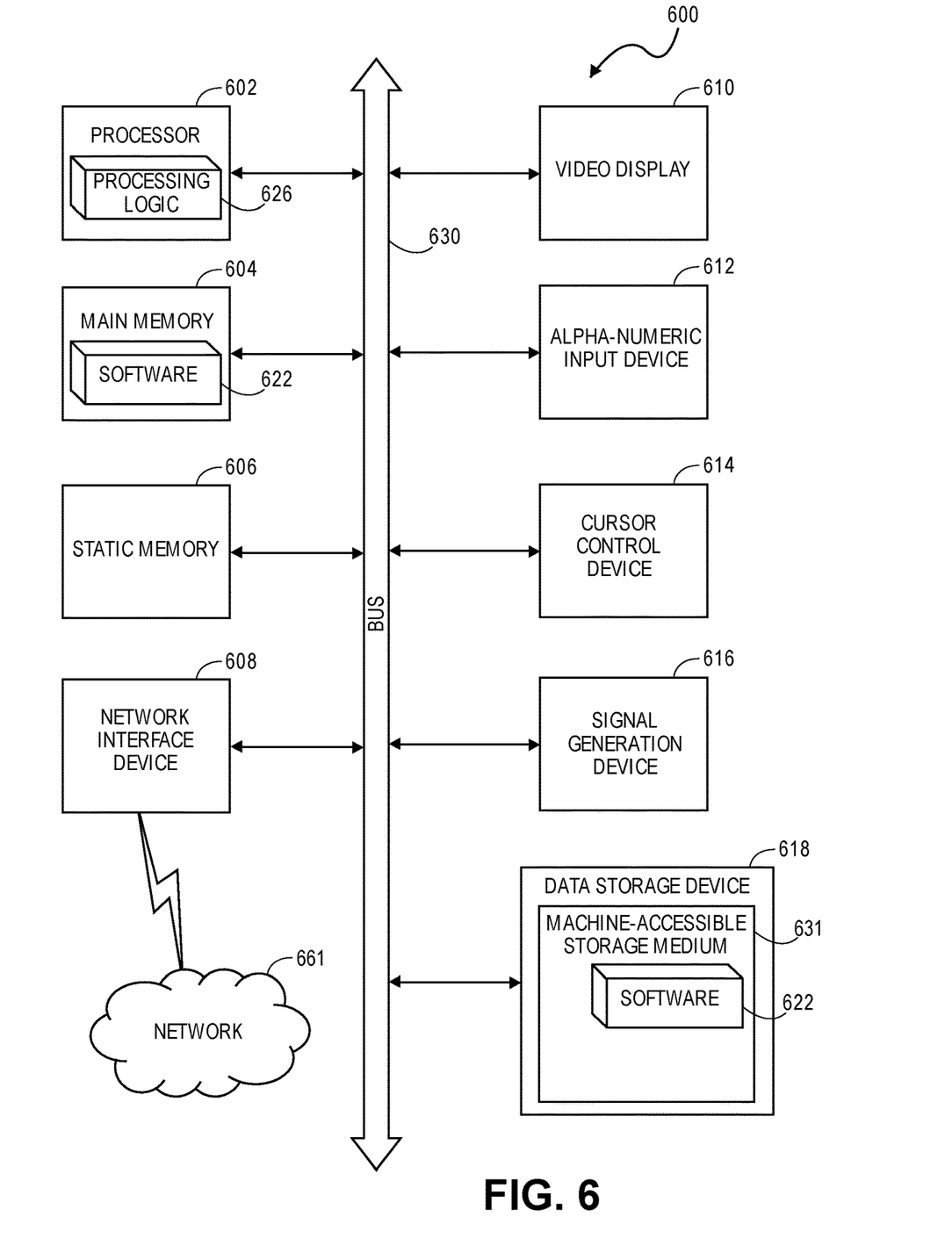
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), MRAM, etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of detecting a temperature error of a dual channel pyrometer.

Thus, methods for measuring temperature errors of a dual channel pyrometer have been disclosed.

What is claimed is:

1. A processing tool, comprising:
a chamber;
a substrate support in the chamber;
a reflector below the substrate support;
a heating unit coupled to the chamber, wherein the heating unit is configured to heat a substrate supported by the substrate support; and
a pyrometer passing through the reflector, wherein the pyrometer is configured to measure a temperature of the substrate, the pyrometer for determining a temperature error using a reflectivity, the temperature error for comparing with an estimated temperature error provided by a physics based model, wherein the temperature error is stored for future use when an absolute value of a difference between the temperature error and the estimated temperature error is less than a predetermined threshold, wherein the pyrometer comprises:
a light pipe;
focusing optics;
a first sensor configured to detect light emitted from a relatively small spot on the substrate above the light pipe; and
a second sensor configured to detect light from a wider angle than the first sensor.

2. The processing tool of claim 1, wherein the first sensor is oriented vertically and the second sensor is oriented horizontally.

3. The processing tool of claim 2, wherein the focusing optics includes a mirror to direct the light emitted from the relatively small spot on the substrate to the vertically oriented first sensor.

4. The processing tool of claim 1, wherein the first sensor and the second sensor are configured to detect changes in the reflectivity of the reflector.

5. The processing tool of claim 1, wherein the processing tool is a rapid thermal processing (RTP) tool.

6. The processing tool of claim 1, further comprising:
a plurality of pyrometers.

7. A system for processing substrates, comprising:
a chamber;
a substrate holder for supporting a substrate;
a heating element for heating the substrate;
a reflector plate below the substrate; and
a pyrometer through the reflector and configured to measure a temperature of the substrate, wherein the pyrometer is capable of being used to detect a temperature error resulting from deposition on the reflector plate, wherein a method to detect the temperature error comprises:
measuring a first signal with a first sensor of the pyrometer;
measuring a second signal with a second sensor of the pyrometer;
determining a reflectivity of the reflector plate from the first signal and the second signal;
determining the temperature error using the reflectivity; and
comparing the temperature error with an estimated temperature error provided by a physics based model, wherein the temperature error is stored for future use when an absolute value of a difference between the temperature error and the estimated temperature error is less than a predetermined threshold.

8. The system of claim 7, wherein the first sensor is an emissometer sensor and the second sensor is a main sensor, and wherein the first signal from the emissometer sensor is an IE signal and the second signal from the main sensor is an IM signal.

9. The system of claim 8, wherein the reflectivity of the reflector plate is determined using a ratio of the IE signal to the IM signal.

10. The system of claim 9, wherein the temperature error is proportional to the change in the reflectivity of the reflector plate compared to an original state of the reflector plate.

* * * * *